(12) United States Patent
Ganesan et al.

(10) Patent No.: US 8,555,225 B1
(45) Date of Patent: Oct. 8, 2013

(54) HIERARCHICAL STRESS PARAMETER ANNOTATION

(75) Inventors: Raghuraman Ganesan, San Ramon, CA (US); Am Moshtaque Yusuf, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/570,048

(22) Filed: Aug. 8, 2012

(51) Int. Cl.
  *G06F 9/455* (2006.01)
  *G06F 17/50* (2006.01)

(52) U.S. Cl.
  USPC ........... 716/111; 716/113; 716/115; 716/127; 716/135; 716/133

(58) Field of Classification Search
  USPC .............. 716/110, 111, 113, 115, 127, 133, 716/135
  See application file for complete search history.

(56) References Cited

U.S. PATENT DOCUMENTS

| | | | |
|---|---|---|---|
| 7,802,218 B2 | 9/2010 | Inoue et al. | |
| 8,020,128 B2 | 9/2011 | Joseph et al. | |
| 2005/0216873 A1* | 9/2005 | Singh et al. | 716/5 |
| 2009/0144670 A1* | 6/2009 | Chidambarrao et al. | 716/2 |
| 2009/0187868 A1 | 7/2009 | Jain et al. | |
| 2010/0270597 A1* | 10/2010 | Sproch et al. | 257/255 |
| 2011/0185326 A1 | 7/2011 | Ueda et al. | |
| 2011/0258588 A1* | 10/2011 | Sharma et al. | 716/108 |
| 2012/0210283 A1* | 8/2012 | Li et al. | 716/112 |

* cited by examiner

*Primary Examiner* — Thuan Do
*Assistant Examiner* — Brian Ngo
(74) *Attorney, Agent, or Firm* — Lawrence J. Merkel; Meyertons, Hood, Kivlin, Kowert & Goetzel, P.C.

(57) ABSTRACT

In an embodiment, the design flow is modified to avoid the flattening process but still accurately annotate the transistors with stress parameters. The location-based stress parameters may be generated, but may not be provided to the LVS tool. Instead, a hierarchical LVS process may be performed, black-boxing lower level blocks that already have stress parameter assignments, preserving hierarchy, etc. The output database from LVS thus includes a cross reference between layout devices and schematic devices, as well as locations of the schematic devices. The database may then be queried for the transistors in the non-flattened design, and the stress parameters may be assigned to the transistors based on the location-based stress parameters. In this fashion the stress parameters may be assigned to the desired transistors, permitting annotation of these parameters into the schematics, without flattening the design and doing unnecessary work on blocks to be skipped.

16 Claims, 4 Drawing Sheets

HIERARCHICAL STRESS PARAMETER ANNOTATION

BACKGROUND

1. Field of the Invention

This invention is related to the field of integrated circuit design tools and, more particularly, to annotating stress parameters onto schematics in a hierarchical design.

2. Description of the Related Art

At current semiconductor fabrication process levels (e.g. 32 nanometer (nm) and below), the transistors in an integrated circuit "chip" are strongly influenced by the structure of the transistors, the nearby circuitry, circuit density, and the location of the transistors on the chip. The effects can be modeled by applying stress parameters to each transistor instance (e.g. a threshold voltage ($V_T$) modifier and a mobility modifier). Unfortunately, the design flow only supports stress parameter annotation as part of a flattening process. That is, even though the design files, such as schematics, can have a hierarchical nature in which a higher-level design file instantiates a lower level design file (potentially multiple times), the hierarchy is first flattened into one larger database. The larger, flat database matches the layout of the chip, allowing the physical location (and corresponding stress parameters) to be identified.

For large designs, the latency to perform the stress parameter annotation is unacceptably long, leading designers to avoid it at higher levels in the hierarchy. Additionally, the flattening destroys the hierarchies, which makes it impossible to skip or black-box individual hierarchies. The underlying circuitry may have already been processed and need not be repeated. Furthermore, it may be desirable to skip some circuit hierarchies, which is not possible in the flat process.

SUMMARY

In an embodiment, the design flow is modified to avoid the flattening process but still accurately annotate the transistors with stress parameters. The location-based stress parameters may be generated, but may not be provided to the logical versus schematic (LVS) tool. Instead, a hierarchical LVS process may be performed, black-boxing lower level blocks that already have stress parameter assignments, preserving hierarchy, etc. The output database from LVS thus includes a cross reference between layout devices and schematic devices, as well as locations of the schematic devices. The database may then be queried for the transistors in the non-flattened design, and the stress parameters may be assigned to the transistors based on the location-based stress parameters. In this fashion the stress parameters may be assigned to the desired transistors, permitting annotation of these parameters into the schematics, without flattening the design and doing unnecessary work on blocks to be skipped.

BRIEF DESCRIPTION OF THE DRAWINGS

The following detailed description makes reference to the accompanying drawings, which are now briefly described.

Figure 1:
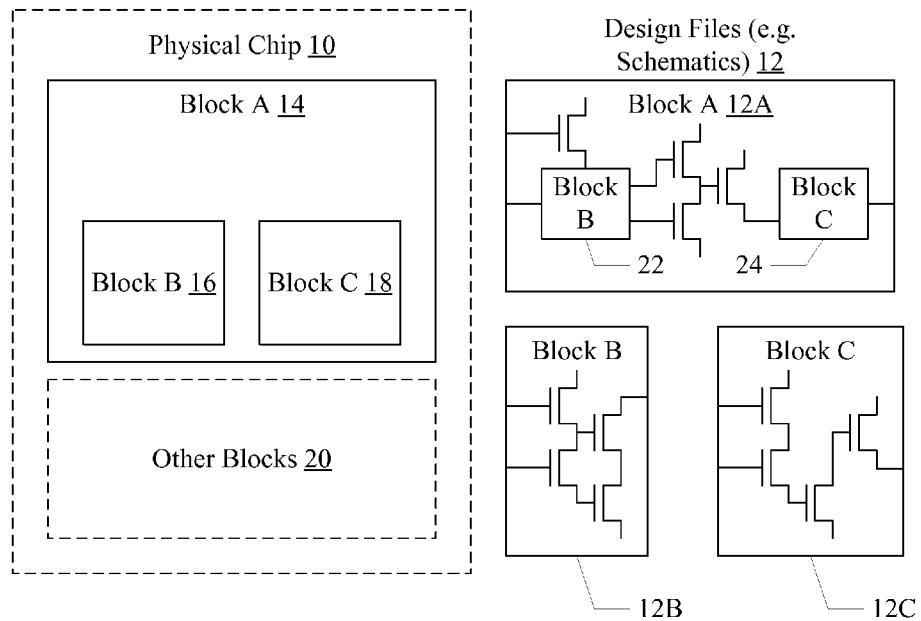
FIG. 1 is a block diagram illustrating an exemplary physical integrated circuit chip and corresponding hierarchical schematic files for one embodiment.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. The memory can include volatile memory such as static or dynamic random access memory and/or nonvolatile memory such as optical or magnetic disk storage, flash memory, programmable read-only memories, etc. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Turning now to FIG. 1, a block diagram of one embodiment of an integrated circuit chip 10 is shown along with a set of design files 12 corresponding to a portion of the chip 10 for this embodiment. The chip 10 as illustrated in FIG. 1 may represent the physical distribution of circuitry on the chip 10. Thus, there is a block A 14 that includes subblocks B and C (reference numerals 16 and 18, respectively). There may also be other blocks 20. The block/subblock relationship may refer to a hierarchy in the design files 12. Thus, a subblock may be a block that is instantiated by another block in the design files 12. For example, in the illustrated embodiment, the design files 12 are schematics. The schematic 12A corresponds to the block A 14; the schematic 12B corresponds to the block B 16; and the schematic 12C corresponds to the block C 18. The schematic 12A includes various circuitry (e.g. transistors) as well as instantiations of schematics 12B-12C (shown as block boxes in FIG. 1). That is, the schematic 12A includes a reference to the schematics 12B and 12C, along with input and output connects between the references and other circuitry in the schematic 12A. When the chip 10 is physically implemented, that hierarchy may disappear and the circuitry corresponding to blocks 16 and 18 may appear within the area occupied by the block 14.

A block may be any logical arrangement of circuitry having a defined set of operations that are implemented by that circuitry. A hierarchical block may instantiate subblocks. Subblocks may also be hierarchical blocks. That is, a subblock may itself instantiate subblocks. A given subblock may be instantiated multiple times in a block (e.g. a memory cell circuit may be instantiated thousands, millions, or even billions of times in a memory array circuit).

The design files 12 may be any electronic description of the corresponding circuitry within a block. For example, the design files 12 in FIG. 1 are schematics. Other design files may include net lists (which describe the circuitry in terms of predefined gates, which may be subblocks of the net list, and interconnect between the gates), register transfer level (RTL) descriptions, etc.

Figure 2:
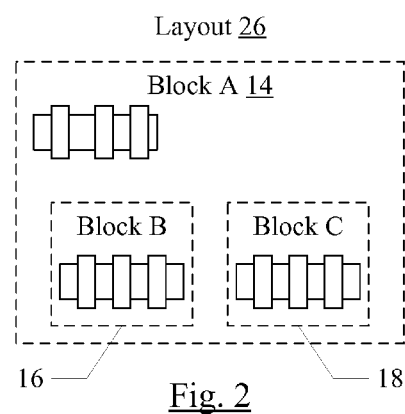
FIG. 2 is a block diagram of a corresponding layout of the chip for one embodiment.

FIG. 2 is a block diagram of one embodiment of a layout 26 corresponding to the block A 14 including the blocks B 16 and C 18. The delimiters of the blocks are shown in dotted fashion in FIG. 2 to indicate that the hierarchy is not actually represented in the layout 26. Instead, the layout 26 may include various shapes that define the circuit structures to be fabricated on the chip 10. For example, shapes may be defined for each mask that is to be produced for the manufacture of the integrated circuit. The shapes may define where the transistors will be placed, the interconnect between the transistors, the gate width and gate length of the transistors, etc.

To ensure that the layout shapes actually define a circuit that is the same as the circuit in a schematic, the LVS tool mentioned previously may be used. The LVS tool may be an electronic design automation (EDA) tool that recognizes the shapes in the layout and the interconnect between the shapes as forming circuitry, and then comparing the recognized circuitry to the design files 12 to ensure that the there is a match between the two. There are a variety of commercially-available LVS tools (e.g. Assura, Dracula, or PVS from Cadence Design Systems, Inc. (San Jose, Calif.), Calibre from Mentor Graphics, Inc. (Wilsonville, Oreg.), Quartz LVS from Magma Design Automation (San Jose, Calif.), Hercules LVS from Synopsys Inc. (Mountain View, Calif.), etc.).

Additionally, the layout 26 may be evaluated to assign various stress parameters to the transistors represented by the layout, based on the surrounding circuitry and other factors. In general, the stress parameters may reflect modifications to the nominal transistor behavior that are induced by the construction, the surrounding circuitry, and/or the environment of a particular instance of the transistor. For example, a transistor may have a nominal threshold voltage ($V_T$), which may be the gate to source voltage at which the transistor is turned "on" and current flow (other than leakage current) is possible through the transistor's source-drain path. One stress parameter may be a threshold voltage modifier that changes the $V_T$ of a transistor instance. The threshold voltage modifier may be a shift, e.g., that may be added to the $V_T$, or may be a multiplier to be multiplied by the $V_T$. Similarly, various transistor properties may describe the current flow through the transistor when it is turned on. A mobility factor may describe the ability of electrons (or holes, or more generically carriers) to flow through the semiconductor. The mobility may have a nominal value, and another stress parameter may be a mobility modifier. The mobility modifier may be a mobility multiplier to be multiplied by the nominal value, or may be a shift to be added to the nominal value. Any other factors that describe the nominal behavior of the transistor may have associated stress parameters as well (e.g. saturation current, leakage current, etc.).

The stress parameters may thus be location-based. That is, the value of a particular stress parameter for a particular transistor is based on the location of the transistor in the overall layout. Stress parameters may be associated with locations in the layout, and the layout representations of the transistors may also be associated with locations in the layout, so the stress parameters may be associated with the layout representation of the transistors. Since the LVS tool determines which layout transistors correspond to which schematic transistors, the association of stress parameters to particular schematic transistors may be made.

Figure 3:
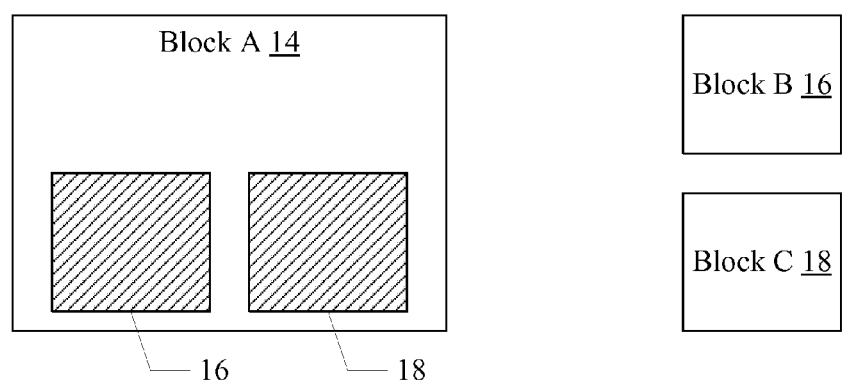
FIG. 3 is a block diagram illustrating hierarchical inputs to the hierarchical process for one embodiment.

The LVS tool may be run on blocks at any level in the hierarchy. Thus, for example, the LVS tool may be run on the blocks B and C 16 and 18. Because these blocks are smaller than the block A 14, the LVS tool may be run more quickly on the blocks B and C 16 and 18 than on the block A 14 (which would also include the blocks B and C if run in flat mode). Once the stress parameters are known for the blocks B and C 14 and 16, it is not necessary to re-process the blocks B and C when identifying the stress parameters for block A 14. FIG. 3 is a block diagram illustrating the desired processing of the blocks A, B, and C (14, 16, and 18 respectively). Blocks B and C 16 and 18 may be processed, and the remainder of block A 14 excluding blocks B and C 16 and 18 (e.g. block-boxed as shown in FIG. 3). That is, the transistors that are part of blocks B and C 16 and 18 may be excluded from processing when block A 14 is processed. However, the LVS tool may only support stress parameter assignment in the flat mode, and thus it is not possible to perform the hierarchical processing described above in the LVS tool. The LVS tool does support a hierarchical mode for performing the LVS checking, however. In the hierarchical mode, blocks at various layers in the hierarchy may be individually processed (e.g. in parallel), and subblocks instantiated within a given block are excluded (or black-boxed).

Figure 4:
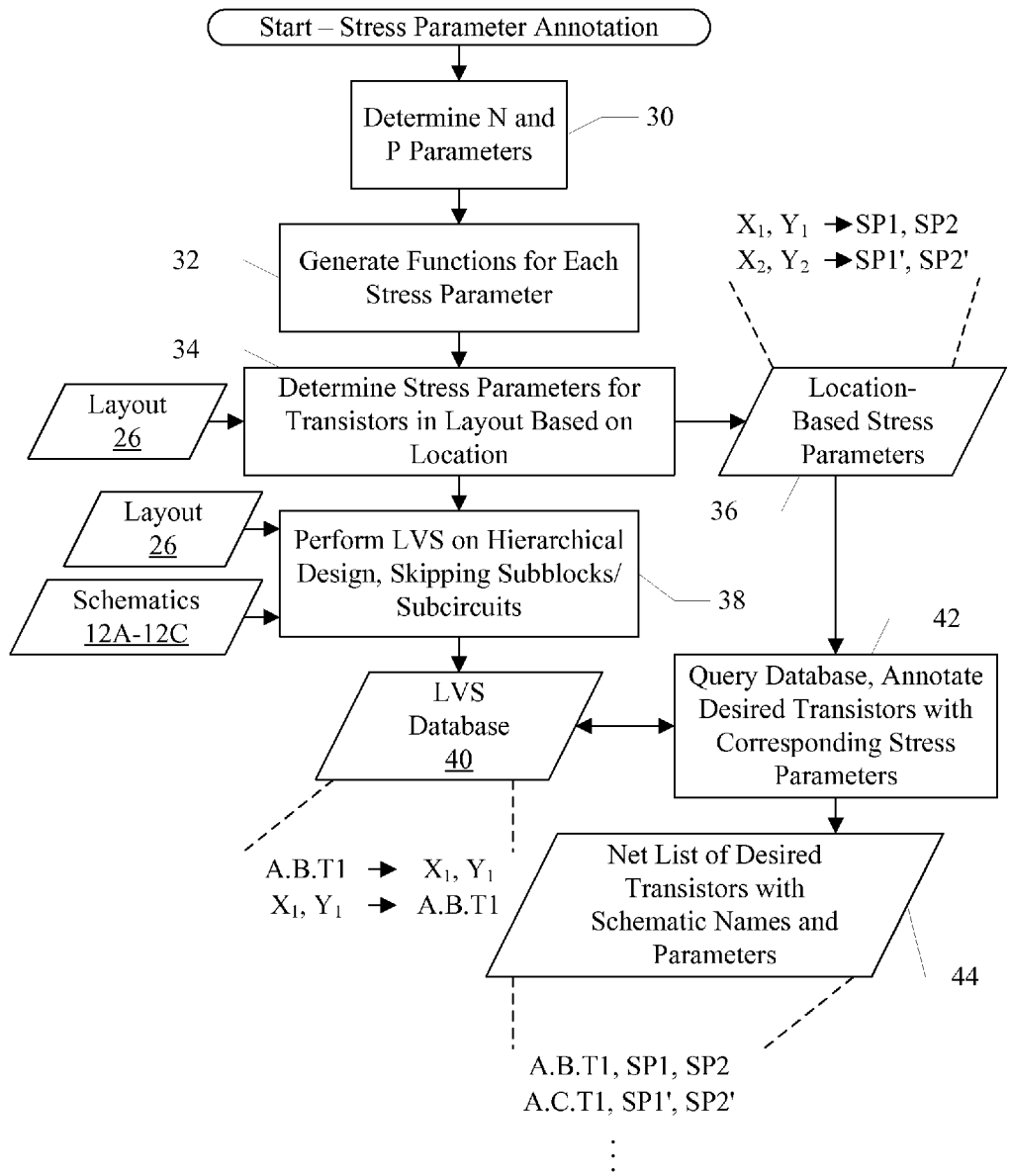
FIG. 4 is a flowchart illustrating one embodiment of stress parameter annotation.

FIG. 4 is a flowchart illustrating operation of one embodiment of a stress parameter annotator that may be used with the LVS tool to preserve hierarchy in the process but also properly assign stress parameters to transistors in the hierarchical design files 12. While the blocks are shown in a particular order in the flowchart for ease of understanding, other orders may be used. The stress parameter annotator may include instructions which, when executed, implement the operation described below.

N and P parameters may be generated for various attributes that may affect transistor operation (e.g. nearby circuit structures, design of the transistor itself such as channel length and width, oxide thickness, dopant density, etc.) (block 30). The N parameters may apply to N-type Metal-Oxide-Semiconductor (NMOS) transistors and the P parameters may apply to P-type MOS (PMOS) transistors. The parameters may be specific to the semiconductor fabrication process to be used to manufacture the chip 10. Based on the N and P parameters, a function may be formulated for each stress parameter (block 32). The functions may be specified by the foundry that implements the semiconductor fabrication process, as the functions may be specific to the semiconductor fabrication process as well.

The stress parameter annotator may receive the layout 26 and the equations for the stress parameters from block 32. The stress parameter annotator may analyze the layout 26 and apply the equations (block 34) to generate the location-based stress parameters (block 36). The location-based stress parameters 36 may be expressed in any desired fashion. For example, as illustrated in exploded view in FIG. 4, the location-based stress parameters may include coordinates within the layout (x, y) and stress parameters for those coordinates (SP1, SP2).

The stress parameter annotator may invoke the LVS tool in a hierarchical mode to perform LVS checking (block 38). In the hierarchical mode, the LVS tool may respect the hierarchy of the design files, rather than flattening them. The inputs to the LVS tool may include the layout 26 and schematics 12A-12C. The LVS tool may generate an LVS database as a result (block 40). The LVS database 40 may associate schematic devices with layout devices, and vice versa. The schematic devices may be named in hierarchical format. For example, a transistor T1 in block B, which is a subblock of block A, may be named A.B.T1 as illustrated in exploded view of the database. The transistor may be associated with a layout device, which may have corresponding coordinates (e.g. x1, y1). The layout device may also have a name, in some embodiments.

The stress parameter annotator may query the LVS database 40 for the transistors for which stress parameter annotation is desired (block 42). Querying the database may include providing the schematic transistor name and requesting output from the database, searching the database for the schematic name, etc. The transistors may be the transistor for a particular block 14, 16, or 18, or all the blocks, as desired. The stress parameter annotator may query the database with the hierarchical schematic transistor (device) name, and obtain the corresponding layout device name and coordinates. With the coordinates, the stress parameter annotator may assign the corresponding location-based stress parameters 36 to the schematic device name. The assignment may include generating a net list 44 or the transistors with schematic names and stress parameters. The annotated net list may be read by the schematic editor program to display the stress parameters on the schematic. Additionally, the annotated net list may be available for simulation to determine if various circuit performance metrics are met (e.g. timing simulations). As illustrated in exploded view in FIG. 4, the annotated net list includes hierarchical device names such as A.B.T1 and the corresponding stress parameters SP1, SP2. In another embodiment, the database 40 may be annotated with the stress parameters, or both the database 40 and the net list 44 may be annotated.

Figure 5:
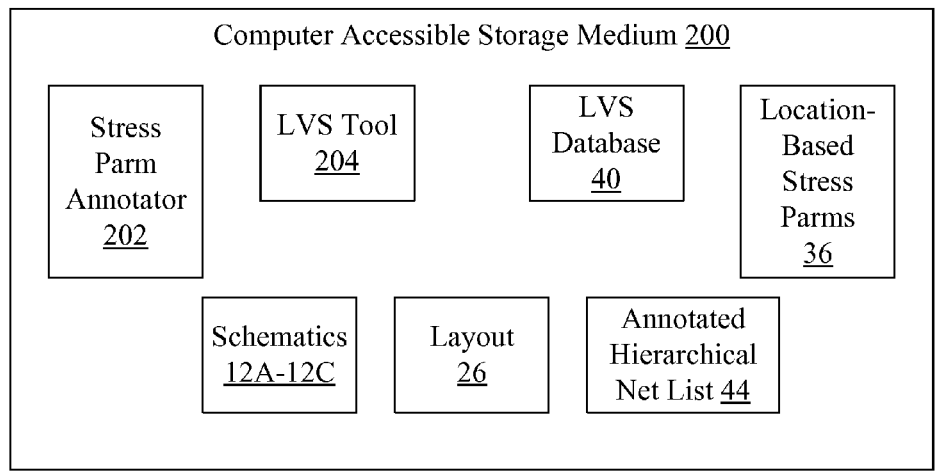
FIG. 5 is a block diagram of one embodiment of a computer accessible storage medium.

Turning now to FIG. 5, a block diagram of one embodiment of a computer accessible storage medium 200 is shown. Generally speaking, a computer accessible storage medium may include any storage media accessible by a computer during use to provide instructions and/or data to the computer. For example, a computer accessible storage medium may include storage media such as magnetic or optical media, e.g., disk (fixed or removable), tape, CD-ROM, DVD-ROM, CD-R, CD-RW, DVD-R, DVD-RW, or Blu-Ray. Storage media may further include volatile or non-volatile memory media such as RAM (e.g. synchronous dynamic RAM (SDRAM), Rambus DRAM (RDRAM), static RAM (SRAM), etc.), ROM, or Flash memory. The storage media may be physically included within the computer to which the storage media provides instructions/data. Alternatively, the storage media may be connected to the computer. For example, the storage media may be connected to the computer over a network or wireless link, such as network attached storage. The storage media may be connected through a peripheral interface such as the Universal Serial Bus (USB).

The computer accessible storage medium 200 in FIG. 5 may store one or more of a stress parameter annotator 202, an LVS tool 204, the LVS database 40, the location-based stress parameters 36, the schematics 12A-12C, the layout 26, and the annotated hierarchical net list 44. The stress parameter annotator 202 may be instructions which, when executed, carry out the various features described as being performed by the stress parameter annotator described above with regard to FIG. 4. Similarly, the LVS tool 204 may be may include instructions which, when executed, carry out the various features described as being performed by the LVS tool 204 above. A carrier medium may include computer accessible storage media as well as transmission media such as wired or wireless transmission.

Figure 6:
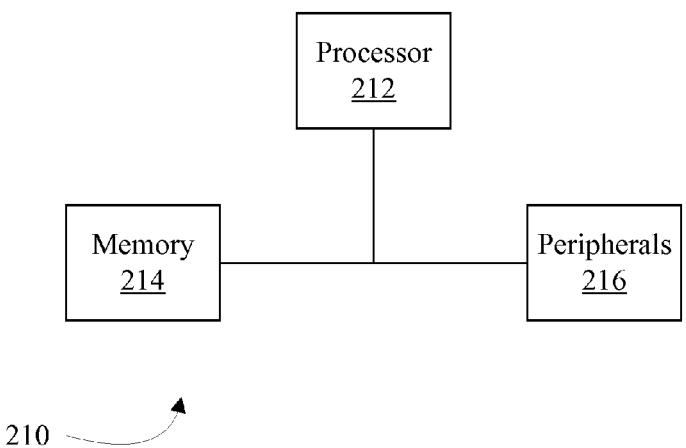
FIG. 6 is a block diagram of one embodiment of a computer system.

FIG. 6 is a block diagram of one embodiment of an exemplary computer system 210. In the embodiment of FIG. 10, the computer system 210 includes a processor 212, a memory 214, and various peripheral devices 216. The processor 212 is coupled to the memory 214 and the peripheral devices 216.

The processor 212 is configured to execute instructions, including the instructions in the software described herein such as the stress parameter annotator 202 and/or the LVS tool 204. In various embodiments, the processor 212 may implement any desired instruction set (e.g. Intel Architecture-32 (IA-32, also known as x86), IA-32 with 64 bit extensions, x86-64, PowerPC, Sparc, MIPS, ARM, IA-64, etc.). In some embodiments, the computer system 210 may include more than one processor.

The processor 212 may be coupled to the memory 214 and the peripheral devices 216 in any desired fashion. For example, in some embodiments, the processor 212 may be coupled to the memory 214 and/or the peripheral devices 216 via various interconnect. Alternatively or in addition, one or more bridge chips may be used to couple the processor 212, the memory 214, and the peripheral devices 216.

The memory 214 may comprise any type of memory system. For example, the memory 214 may comprise DRAM, and more particularly double data rate (DDR) SDRAM, RDRAM, etc. A memory controller may be included to interface to the memory 214, and/or the processor 212 may include a memory controller. The memory 214 may store the instructions to be executed by the processor 212 during use, data to be operated upon by the processor 212 during use, etc.

Peripheral devices 216 may represent any sort of hardware devices that may be included in the computer system 210 or coupled thereto (e.g. storage devices, optionally including a computer accessible storage medium 200, other input/output (I/O) devices such as video hardware, audio hardware, user interface devices, networking hardware, etc.).

Numerous variations and modifications will become apparent to those skilled in the art once the above disclosure is fully appreciated. It is intended that the following claims be interpreted to embrace all such variations and modifications.

What is claimed is:

1. A method comprising:
   generating, on a computer, a set of stress parameters based on locations of transistors within an integrated circuit layout, wherein each stress parameter in the set includes coordinates within the layout to which the stress parameter applies, and wherein each stress parameter in the set includes a modifier for a transistor parameter that applies to the location indicated by the coordinates;
   generating, on the computer, a database of transistors and locations of the transistors corresponding to a block of the integrated circuit, wherein the database maintains a hierarchy of the block and one or more subblocks of the block that are instantiated in an electronic description of the block;
   querying, on the computer, the database of transistors and locations using a schematic transistor name, wherein an output from the database includes coordinates of the transistor identified by the schematic transistor name;

identifying stress parameters from the set of stress parameters that correspond to the schematic transistor name responsive to the coordinates of the stress parameters and the coordinates output from the database; and annotating each queried schematic transistor with identified stress parameters from the set as determined in the querying and the identifying.

2. The method as recited in claim 1 wherein the annotating is performed in the database.

3. The method as recited in claim 1 wherein the annotating is performed in the electronic description of the block.

4. The method as recited in claim 3 wherein the electronic description is a schematic.

5. The method as recited in claim 1 wherein the modifier is a threshold voltage modifier.

6. The method as recited in claim 1 wherein the modifier is a mobility modifier.

7. A non-transitory computer accessible storage medium storing a plurality of instructions which, when executed on a computer:

determine functions for stress parameters;

evaluate the functions over a layout to generate location-based stress parameters;

query a hierarchical layout versus schematic (LVS) database for a plurality of transistors, wherein the hierarchical LVS database maps transistors described in the layout of an integrated circuit to transistors described in a hierarchical schematic;

receive a plurality of coordinates output from the LVS database, each of the plurality of coordinates corresponding to a respective transistor of the plurality of transistors;

compare the plurality of coordinates to coordinates of location-based stress parameters, each of the location-based stress parameters including coordinates to which the location-based stress parameters apply and modifiers for one or more transistors parameters that apply at the coordinates; and annotate the plurality of transistors with the location-based stress parameters having coordinates that match the coordinates from the LVS database.

8. The non-transitory computer accessible storage medium as recited in claim 7 wherein the plurality of instructions, when executed, invoke an LVS tool to generate the LVS database, wherein the LVS tool operates in a hierarchical mode in response to being invoked.

9. The non-transitory computer accessible storage medium as recited in claim 7 wherein the instructions which, when executed, generate the stress parameters include instructions which, when executed, generate a plurality of N-type and P-type transistors parameters for the functions.

10. The non-transitory computer accessible storage medium as recited in claim 7 wherein the modifiers include a threshold voltage modifier and a mobility modifier.

11. A computer system comprising:

a processor; and a memory system coupled to the processor, the memory storing a plurality of instructions during use, wherein the plurality of instructions, when executed by the processor:

determine functions for stress parameters based on a plurality of N-type and P-type transistor parameters; and evaluate the functions over a layout to generate one or more location-based stress parameters search a hierarchical layout versus schematic (LVS) database for a plurality of transistors, wherein the hierarchical LVS database maintains a hierarchy of a plurality of schematics of circuitry implemented by the transistors;

receive coordinates of each of the plurality of transistors from the LVS database;

match the received coordinates to coordinates of the location-based stress parameters, each of the location-based stress parameters including coordinates to which the location-based stress parameters apply and one or more modifiers for one or more transistor parameters; and associate the modifiers from the matching one or more location-based stress parameters with each of the plurality of transistors.

12. The computer system as recited in claim 11 wherein the modifiers include a threshold voltage modifier.

13. The computer system as recited in claim 11 wherein the modifiers include a mobility modifier.

14. The computer system as recited in claim 11 wherein the memory system is further configured to store an LVS tool, and wherein the plurality of instructions, when executed, invoke an LVS tool to generate the hierarchical LVS database, wherein the LVS tool operates in a hierarchical mode in response to being invoked.

15. A non-transitory computer accessible storage medium comprising a plurality of instructions which, when executed:

process a layout of an integrated circuit to generate a plurality of location-based stress parameters, wherein each stress parameter of the plurality of stress parameters includes coordinates within the layout to which the stress parameter applies, and wherein each stress parameter in the plurality of stress parameters includes a modifier for a transistor parameter that applies to the location indicated by the coordinates;

invoke a layout versus schematic (LVS) tool in a hierarchical mode, processing a plurality of hierarchical schematics and the layout to identify transistors in the layout that correspond to transistors in the plurality of hierarchical schematics;

search a database output by the LVS tool for a plurality of transistors, wherein an output of the search from the database includes coordinates of the plurality of transistors;

select ones of the plurality of location-based stress parameters that apply to each of the plurality of transistors responsive to the coordinates of the location-based stress parameters and the coordinates output by the database; and assign the selected ones of the plurality of location-based stress parameters to the plurality of transistors detected in the database.

16. The non-transitory computer accessible storage medium as recited in claim 15 wherein the plurality of instructions, when executed, annotate the plurality of schematics with the selected ones of the plurality of location-based stress parameters.

* * * * *

UNITED STATES PATENT AND TRADEMARK OFFICE
CERTIFICATE OF CORRECTION

PATENT NO. : 8,555,225 B1  
APPLICATION NO. : 13/570048  
DATED : October 8, 2013  
INVENTOR(S) : Raghuraman Ganesan et al.

It is certified that error appears in the above-identified patent and that said Letters Patent is hereby corrected as shown below:

In the Claims:

Claim 11, Column 8, Line 2, please delete "parameters" and substitute -- parameters; --

Signed and Sealed this
Twenty-eighth Day of January, 2014

Michelle K. Lee
*Deputy Director of the United States Patent and Trademark Office*